United States Patent
Nakamura et al.

(10) Patent No.: US 6,239,032 B1
(45) Date of Patent: May 29, 2001

(54) POLISHING METHOD

(75) Inventors: Kenro Nakamura, Kamakura; Hiroyuki Yano, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/207,629

(22) Filed: Dec. 9, 1998

(30) Foreign Application Priority Data

Dec. 12, 1997 (JP) .................................................... 9-343074

(51) Int. Cl.⁷ ............................. B44C 1/22; H01L 21/00
(52) U.S. Cl. ............................................. 438/693; 216/89
(58) Field of Search ..................... 216/17, 88–92; 438/692–693

(56) References Cited

U.S. PATENT DOCUMENTS 5,770,095 * 6/1998 Sasaki et al. ........................ 216/38
5,783,489 * 7/1998 Kaufman et al. .................... 438/692
6,077,773 * 6/2000 Lin ...................................... 438/637

FOREIGN PATENT DOCUMENTS 6-124932    5/1994 (JP) .

* cited by examiner

Primary Examiner—Gregory Mills
Assistant Examiner—Alva C Powell
(74) Attorney, Agent, or Firm—Finnegan, Henderson, Farabow, Garrett & Dunner, L.L.P.

(57) ABSTRACT

A silicon nitride film is formed on a base layer having a silicon oxide film and a trench, in such a manner that the trench of the base layer is filled with the silicon nitride film. Subsequently, the silicon nitride film is selectively polished with reference to the silicon oxide film, with the silicon oxide film used as a stopper. The silicon nitride film is polished in a chemical mechanical polishing process that uses slurry containing a phosphoric acid and silica whose particle diameter is less than 10 nm, or slurry containing a phosphoric acid derivative and silica whose particle diameter is less than 10 nm. As a result of this selective polishing, the silicon nitride film selectively remains inside the trench.

2 Claims, 3 Drawing Sheets

POLISHING METHOD

BACKGROUND OF THE INVENTION

The present invention relates to a polishing method using chemical mechanical polishing (CMP), and more particularly to a polishing method suitable for use in the manufacture of semiconductor devices.

In association with the recent trend toward the high integration and miniaturization of semiconductor devices, various kinds of fine structure working technology are being researched and developed in the field of the manufacture of semiconductor devices. Among the various kinds of technology, the CMP technology can be used for many purposes, such as the flattening of the interlayer insulation film, the formation of plugs, the formation of buried metal wiring, and buried isolation of elements. The CMP technology, required for executing these, is now essential technology.

In the manufacture of semiconductor devices, there is a demand for a reliable process in which a silicon nitride film is polished using CMP, with a silicon oxide film used as a stopper. If such a process is available, it can be applied to the buried isolation of elements, the formation of a self-aligned contact, etc., thus enabling the fabrication of devices that are reliable and have high performance. However, in the case where conventional slurry is used, the ratio (selection ratio) of the polishing rate of a silicon nitride film to that of a silicon oxide film is smaller than 1. In this case, the process described above cannot be put to use.

As a method for realizing the above-described process, it is thought to prepare slurry by dispersing silica particles (polishing particles) in water and adding phosphoric acid to the water. The use of such slurry is proposed in Jpn. Pat. Appln. KOKAI Publication No. 6-124932. According to the method shown in this publication, it may be able to set the selection ratio to be larger than 1.

However, even when the method of KOKAI publication No. 6-124932 is used, it is hard to set the selection ratio to be sufficiently large. In particular, in the case of a fine pattern of 0.2 $\mu$m or less, the substantial selection ratio is inevitably small.

BRIEF SUMMARY OF THE INVENTION

The present invention has been made in consideration of the above problems, and is intended to provide a polishing method that can provide a sufficiently large selection ratio even in the case of a fine pattern.

According to one polishing method provided by the present invention, a silicon nitride film formed on a silicon oxide film is selectively polished with reference to the silicon oxide film in a chemical mechanical polishing process, the chemical mechanical polishing process using slurry containing a phosphoric acid and silica whose particle diameter is less than 10 nm, or slurry containing a phosphoric acid derivative and silica whose particle diameter is less than 10 nm.

Another polishing method provided by the present invention comprises the steps of: forming a silicon nitride film on a base layer, which has a silicon oxide film and a depression, such that the depression of the base layer is filled with the silicon nitride film; and selectively polishing the silicon nitride film with reference to the silicon oxide film, using the silicon oxide film as a stopper, so as to selectively remain the silicon nitride film inside the depression, the silicon nitride film being polished in a chemical mechanical polishing process that uses slurry containing a phosphoric acid and silica whose particle diameter is less than 10 nm, or uses slurry containing a phosphoric acid derivative and silica whose particle diameter is less than 10 nm.

The ratio (selection ratio) of the polishing rate of a silicon nitride film to that of a silicon oxide film can be set to be larger than 1 by using slurry containing both a phosphoric acid (or its derivative) and silica (which is mainly formed of $SiO_2$ and serves as polishing powder). In actuality, however, a sufficiently large selection ratio cannot be easily attained, as described above. According to the present invention, silica whose particle diameter is less than 10 nm is used, and use of such silica enables the selection ratio to be sufficiently large in practice.

In particular, in the case of a highly-integrated fine pattern wherein the width of a depression (such as a trench) is 0.2 $\mu$m or less, the effect to make the selection ratio large is remarkably available according to the present invention. In the case of such a fine pattern, therefore, the silicon nitride film is polished, with the silicon oxide film as a stopper. With the polishing executed in this manner, the depression can be reliably filled with the silicon nitride film.

As described above, according to the present invention, the silicon nitride film can be polished with a sufficiently large selection ratio even in the case of a fine pattern. By applying the present invention to a semiconductor device-manufacturing process, it is possible to provide high-performance and reliable semiconductor devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
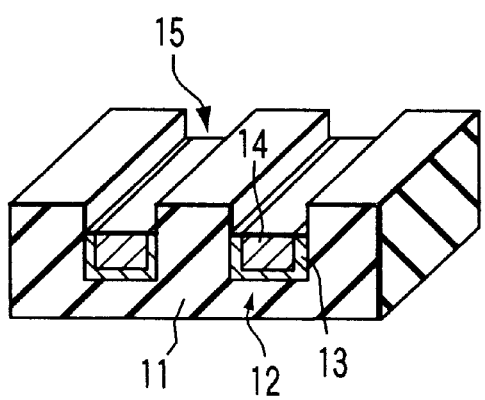
FIGS. 1A through 1F show the steps of a manufacturing process according to the first embodiment of the present invention.

Embodiments of the present invention will now be described with reference to the accompanying drawings.

FIGS. 1A to 1F are a process chart showing the first embodiment; they illustrate the case where the polishing method of the present invention is applied to the process in which a contact section is provided adjacent to buried wiring. The following description will be given by referring to FIGS. 1A to 1F in this order.

First of all, trenches 12 are formed in a silicon oxide film 11, which is provided on the major surface side of a semiconductor substrate (not shown) formed of silicon or the like. The trenches 12 are formed by use of a lithography process and a reactive ion etching process. The trenches have a width of 0.2 µm or so, and arranged at a pitch of 0.4 µm. Then, a barrier metal 13, such as TiN, WN or the like, is deposited over the resultant semiconductor structure by sputtering, in such a manner that the trenches 12 are not completely filled with the barrier metal 13. Subsequently, a tungsten film 14 (a metal film having a high melting point) is deposited over the semiconductor structure by CVD, in such a manner that the trenches 12 are completely filled. The tungsten film 14 and the barrier metal 13 are polished by use of the conventional CMP process using ordinary slurry, until the surface of the silicon oxide film 11 is exposed. As a result, the tungsten film 14 and the barrier metal 13 are made to have a flat surface, and the tungsten film 14 constitutes a wiring layer. Then, the tungsten film 14 and the barrier metal 13 are selectively etched by use of the reactive ion etching process so as to form a trench 15 that has a step inside (see FIG. 1A).

Figure 1B:
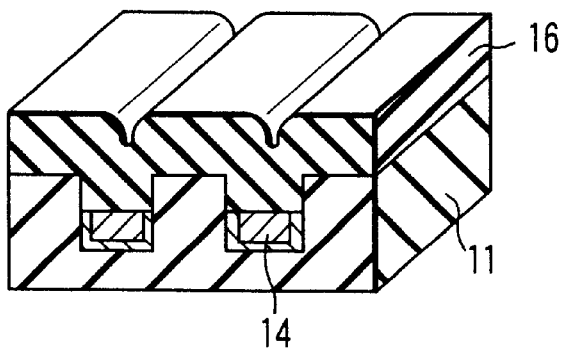

Then, a silicon nitride film 16 is deposited over the semiconductor structure by CVD in such a manner that the trench 15 is filled (see FIG. 1B).

Subsequently, the silicon nitride film 16 is polished by use of the CMP process, with the silicon oxide film 11 used a stopper. By this polishing, the silicon nitride film 16 is made to have a flat surface. The slurry used in the polishing enables the silicon nitride film to be polished with a large selection ratio with reference to the silicon oxide film. The slurry contains silica serving as polishing particles and having particle diameter of 10 nm or less. A phosphoric acid is included in the slurry as an additive. A suitable concentration of the polishing particles is in the range of 5 to 10% by weight, and a suitable concentration of the phosphoric acid is 2.5% or more than 2.5% by weight. The load exerted during polishing is 400 g/cm$^2$, and the top ring and the turntable are rotated at 50 rpm. (Refer to FIG. 1C.)

Figure 2A:
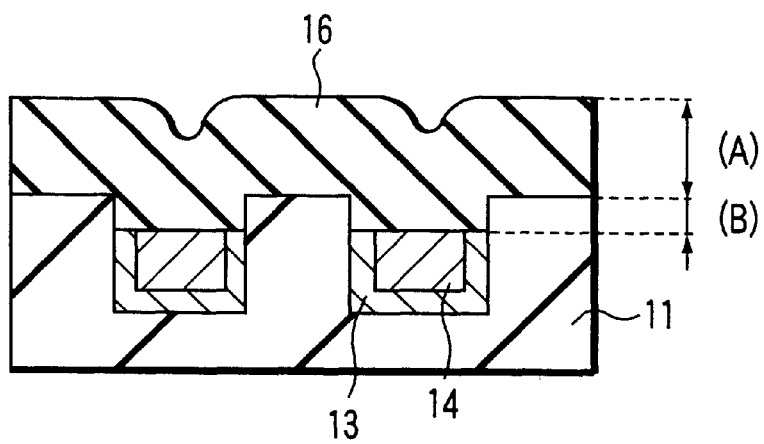
FIG. 2A is a front view of the structure depicted in FIG. 1B.

In order to suppress the thinning of the silicon nitride film 16 in the CMP process described above, the particle diameter of the silica used as a polishing particle have to be as small as 10 nm or less. This point will be described with reference to FIGS. 2A and 2B. FIG. 2A is a front view of the structure shown in FIG. 1B. In FIG. 2A, region (A) is a region where only the silicon nitride film 16 exits, while region (B) is a region where both the silicon nitride film 16 and the silicon oxide film 11 exit.

Figure 2B:
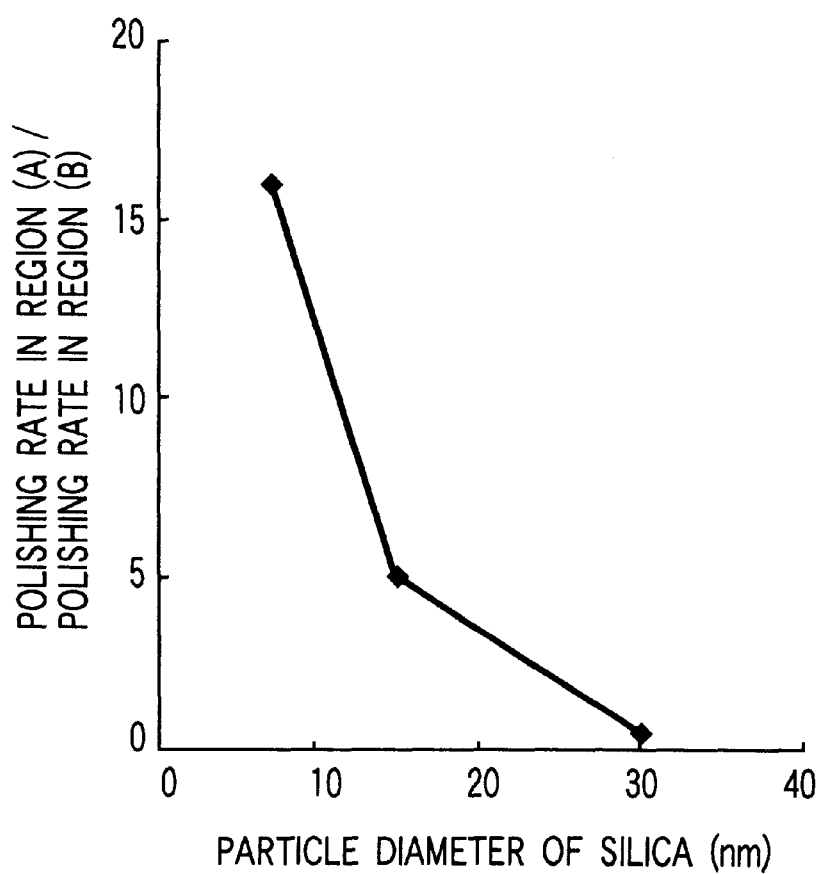
FIG. 2B is a graph in which the ratio of the polishing rate of region (A) to the polishing rate of region (B) varies in relation to the particle diameter of silica.

The polishing rates in regions (A) and (B) were measured by using silica having different diameters. By this measurement, the data in FIG. 2B are obtained, which show the relationships between the ratio (selection ratio) of the polishing rate in region (A) to the polishing rate in region (B) and the particle diameters of the silica (polishing particles). The selection ratio must be increased so as to suppress the thinning of the silicon nitride film 16. From the graph in FIG. 2A and FIG. 2B, it can be understood that the smaller the particle diameters of the silica, the larger the selection ratio is. The selection ratio is remarkably large when the particle diameter of the silica is 10 nm or less. A large selection ratio (larger than 10 or so) is required so as to provide a constant thickness of the silicon nitride film formed in a single wafer or formed in different wafers. In conclusion, in view of the data shown in FIG. 2A and FIG. 2B, it is desirable that the particle diameter of the silica be 10 nm or smaller.

In the case where the silicon nitride film and the silicon oxide film are polished independently of each other, a decrease in the particle diameter of the silica leads to a slight increase in the polishing rate of the silicon nitride film and a marked decrease in the polishing rate of the silicon oxide film. Therefore, the reason that a reduction in the particle diameter of the silica results in a large selection ratio is attributable to the fact that the polishing rate of the silicon oxide film 11 decreases.

Where a highly integrated fine pattern, such as that shown in the drawings, is subjected to polishing, the substantial selection ratio can be increased by using silica having small particle diameters. This increase is attributable to the following mechanism. In the case where the silicon nitride film 16 and the silicon oxide film 11 are arranged at high density (i.e., they are spaced from each other by a distance of 0.2 µm), the boundary portions between them are structurally weak in comparison with the bulk portions. With this structure, it is thought that polishing takes place in such a manner that the boundary portion is eroded first, eventually causing the silicon oxide film 11 to be polished at high rate. If the silica is made of fine particles, the silicon oxide film 11 used as a stopper is not polished much. Since, therefore, the polishing rate of the silicon oxide film 11 is low, soft polishing is enabled for the silicon oxide film 11. Accordingly, the polishing of the silicon oxide film is retarded at the boundary portion, and the selection ratio is considered to increase even in the case of a fine pattern.

Figure 1C:
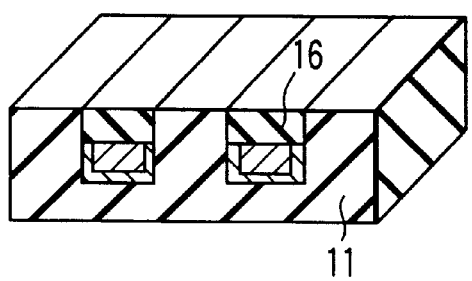
Figure 1D:
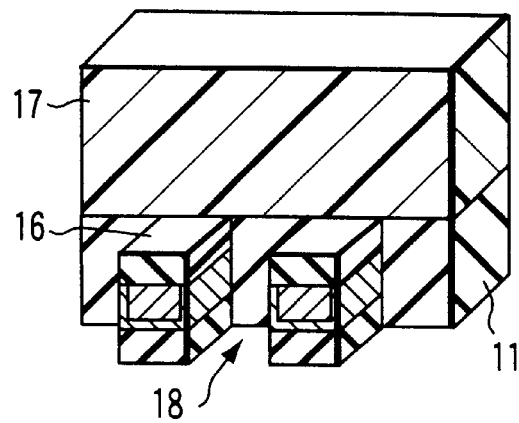
Figure 1E:
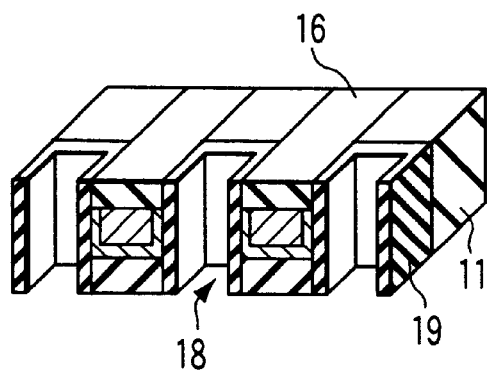
Figure 1F:
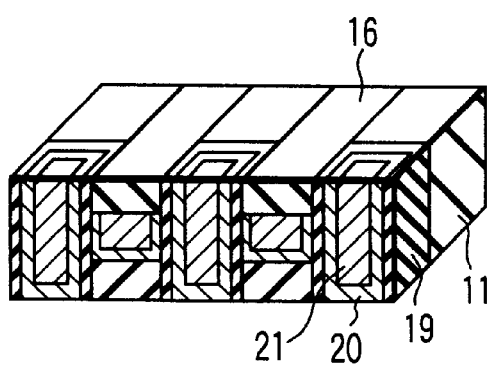

After the step shown in FIG. 1C is executed, a photoresist 17 is formed by use of a line-and-space pattern that is orthogonal to the trenches 12. Subsequently, the silicon oxide film 11 is etched by use of the reactive ion etching process under the conditions that provide an etching rate higher than the etching rates of the photoresist 17 and the silicon nitride film 16. By this etching, a contact hole 18 is formed in a self-alignment manner. (Refer to FIG. 1D.)

After the photoresist 17 is removed, a silicon nitride film is deposited over the resultant semiconductor structure. Then, the semiconductor structure is etched back by use of the reactive ion etching process. As a result, the side wall of the contact hole 18 is covered with a silicon nitride film 19. (Refer to FIG. 1E.)

A barrier metal 20 and a tungsten film 21 are sequentially deposited, so that the contact hole 18 is filled with them. Then, the tungsten film 21 and the barrier metal 20 are polished by the CMP process using conventional (or ordinary) slurry. This polishing process is continued until the silicon oxide film 11 and the silicon nitride film 16 are exposed. By this polishing, the tungsten film 21 and the barrier metal 20 are made to have a flat surface. (Refer to FIG. 1F.)

In the semiconductor device manufactured in the above steps, the tungsten film 14 constitutes a wiring layer, which can be used as a bit line of a memory cell. A contact section, which is formed adjacent to the bit line, can be used as a storage node contact. Since the contact section is formed in a self-alignment manner, no margin is required for positioning, and the chip can be small in size. This leads to high integration of the semiconductor device.

If the silicon nitride film 16 is polished, using the conventional (or ordinary) slurry, the silicon oxide film 11 does not serve as a stopper since the polishing rate of the silicon oxide film is greater than that of the silicon nitride film. In this case, the thickness of the silicon nitride film 16 in the buried section cannot be easily controlled in the step shown in FIG. 1C. If the silicon nitride film 16 is too thin, it is likely that the tungsten film 14 will be damaged when the reactive ion etching is executed for the formation of the contact hole 18.

The slurry used in the above embodiment enables the silicon nitride film to be selectively etched with reference to the silicon oxide film. That is, the slurry contains a phosphoric acid, and silica powder (polishing particles) having particle diameter of 10 nm or less. Due to the use of such slurry, the silicon oxide film 11 is made to serve as a stopper, and the silicon nitride film 16 can be selectively polished. By this selective polishing, the thickness of the silicon nitride film 16 in the buried section can be reliably controlled to be a desired value. Even if the slurry contains a phosphoric acid and silica (polishing powder), the particle diameter of the silica must not be large. If it is large, the substantial selection ratio remains small in the case of a high-integration pattern as described in the above embodiment. This means that the use of fine silica powder as polishing particles is essential.

FIGS. 3A through 3E show the steps of a manufacturing process according to the second embodiment of the present invention. In the second embodiment, the polishing method of the present invention is applied to the element isolation process included in the manufacture of a semiconductor device. The description below will be given by referring to FIGS. 3A to 3E in this order.

Figure 3A:
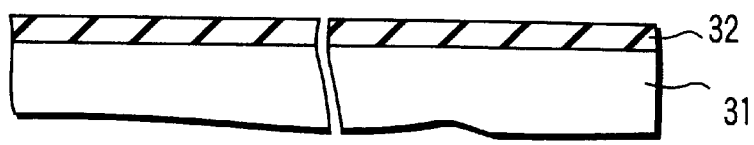
FIGS. 3A through 3E show the steps of a manufacturing process according to the second embodiment of the present invention.
Figure 3B:
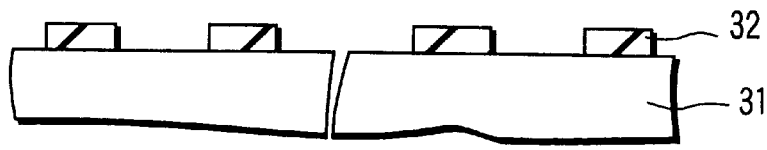
Figure 3C:
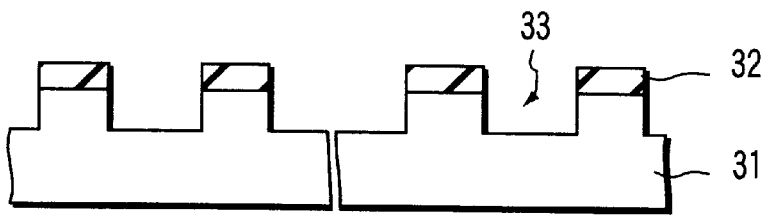
Figure 3D:
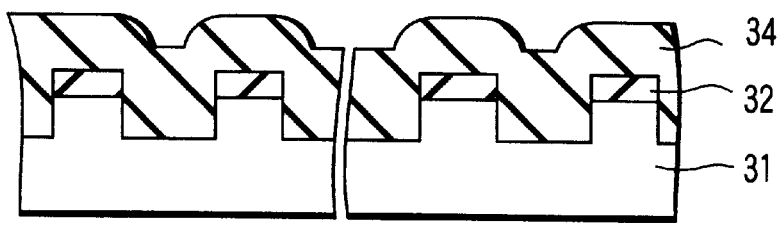

First of all, a silicon oxide film 32 is formed on a silicon substrate 31 by CVD or thermal oxidation until the thickness of the silicon oxide film 32 becomes 400 nm (FIG. 3A). Then, the silicon oxide film 32 is patterned to have a predetermined shape (FIG. 3B). Subsequently, the reactive ion etching is executed, with the silicon oxide film 32 as a mask. By this etching, an element isolation trench 33 having a depth of 700 nm is formed in the silicon substrate 31 (FIG. 3C). Thereafter, a silicon nitride film 34 having a thickness of 800 nm is formed on the resultant semiconductor structure by CVD. The element isolation trench 33 is filled with this silicon nitride film 34 (FIG. 3D). With the silicon oxide film 32 used as a stopper, the silicon nitride film 34 is polished by use of the CMP process (FIG. 3E).

Figure 3E:
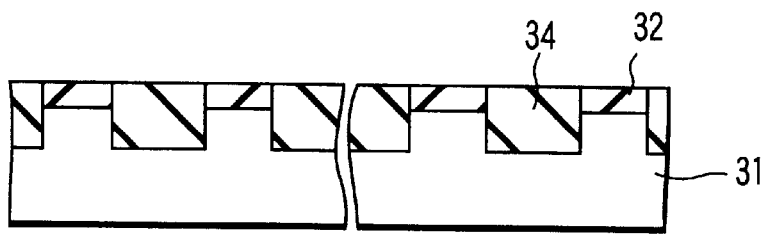

The slurry used in the CMP process shown in FIG. 3E enables the silicon nitride film to be polished with a large selection ratio with reference to the silicon oxide film. As in the first embodiment, the slurry includes silica as polishing particles and contains a phosphoric acid as an additive. A suitable concentration of the polishing particles is in the range of 5 to 10% by weight, and a suitable concentration of the phosphoric acid is 2.5% or more than 2.5% by weight. The load exerted during polishing is 400 g/cm$^2$, and the top ring and the turntable are rotated at 50 rpm.

In order to suppress the thinning of the silicon nitride film 34 in the CMP process described above, the particle diameters of the silica used as a polishing particle has to be small. This is because the polishing rate of the silicon oxide film used as a stopper can be remarkably low by using silica of small particle diameters. Moreover, the use of fine-particle silica is required to provide a large substantial selection ratio for a high-integration pattern. It is desirable that the particle diameter of silica be 10 nm or less.

Figure 4:
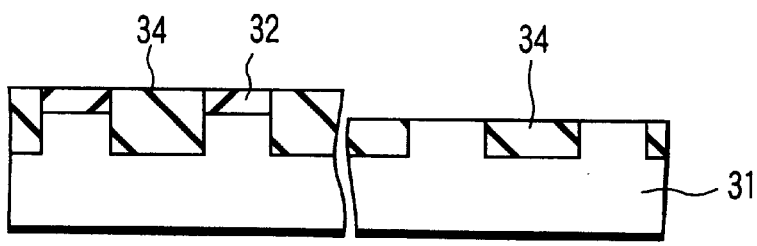
FIG. 4 illustrates the problems of the case where the steps shown in FIGS. 3A to 3E are executed according to the conventional technology.

If the silicon nitride film 34 is polished by use of the conventional (or ordinary) slurry, the silicon oxide film 32 does not serve as a stopper. This is because the polishing rate of the silicon nitride film is about ⅓ of the polishing rate of the silicon oxide film. In addition, it is not easy to provide a uniform polishing rate for every portion of a wafer. As shown in FIG. 4, therefore, when the polishing has taken place to the surface of the silicon oxide film 32 in a low-polishing rate portion of the wafer, all the silicon oxide film 32 will be polished away in a high-polishing rate portion of the wafer. As a result, the silicon substrate 31 and the silicon nitride film 34 are greatly polished away in some portions of the water.

The slurry used in the present embodiment enables the silicon nitride film to be selectively etched with reference to the silicon oxide film. Due to the use of such slurry, the polishing rate of the silicon nitride film can be sufficiently high in comparison with the polishing rate of the silicon oxide film. As shown in FIG. 3E, therefore, the CMP process can be brought to an end when the silicon oxide film 32 has been slightly polished. Hence, the buried section can be controlled to have a desired shape. Even if the slurry contains a phosphoric acid and silica (polishing powder), the particle diameter of the silica must not be large. If it is large, the substantial selection ratio remains small in the case of a high-integration pattern as described in the above embodiment. This means that the use of fine silica powder as polishing particles is essential to the present invention.

In the first and second embodiments described above, phosphoric acid is added to the slurry. Instead of phosphoric acid, however, a phosphoric acid derivative can be used without giving rise to any adverse effects on the advantages of the present invention. In addition, the conditions under which the CMP process is executed are not limited to those described above. They can be arbitrarily modified without departing from the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising the steps of:

forming a silicon nitride film on a base layer, which has a silicon oxide film and a depression, such that the depression of the base layer is filled with the silicon nitride film; and selectively polishing the silicon nitride film with reference to the silicon oxide film, using the silicon oxide film as a stopper, so as to selectively refine the silicon nitride film inside the depression, said silicon nitride film being polished in a chemical mechanical polishing process that uses slurry containing a phosphoric acid and silica whose particle diameter is less than 10 nm, or slurry containing a phosphoric acid derivative and silica whose particle diameter is less than 10 nm.

2. A method according to claim 1, wherein the width of the depression is 0.2 μm or less.

* * * * *

UNITED STATES PATENT AND TRADEMARK OFFICE
CERTIFICATE OF CORRECTION

PATENT NO.    : 6,239,032 B1
DATED         : May 29, 2001
INVENTOR(S)   : Kenro Nakamura et al.

It is certified that error appears in the above-identified patent and that said Letters Patent is hereby corrected as shown below:

<u>Column 6, claim 1,</u>
Line 54, "refine" should read -- retain -- .

Signed and Sealed this

Second Day of April, 2002

*Attest:*

*Attesting Officer*

JAMES E. ROGAN
*Director of the United States Patent and Trademark Office*